(12) United States Patent
Kim

(10) Patent No.: US 7,737,922 B2
(45) Date of Patent: Jun. 15, 2010

(54) LIGHT EMITTING DEVICE

(75) Inventor: Do Wan Kim, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 824 days.

(21) Appl. No.: 11/455,706

(22) Filed: Jun. 20, 2006

(65) Prior Publication Data

US 2007/0085787 A1 Apr. 19, 2007

(30) Foreign Application Priority Data

Oct. 14, 2005 (KR) .................... 10-2005-0097043
Oct. 15, 2005 (KR) .................... 10-2005-0097254

(51) Int. Cl.
*G09G 3/30* (2006.01)
*G09G 3/32* (2006.01)
*G09G 5/00* (2006.01)
*G09G 3/10* (2006.01)
*G06F 3/038* (2006.01)
*H01J 17/00* (2006.01)
*H01J 17/04* (2006.01)

(52) U.S. Cl. .................... 345/76; 345/82; 345/204; 315/169.3; 313/581; 313/631

(58) Field of Classification Search ................ 345/55, 345/76, 82, 698, 204; 315/169.3; 313/590, 313/581–604, 631, 632, 326–357
See application file for complete search history.

(56) References Cited

U.S. PATENT DOCUMENTS

| | | | | | |
|---|---|---|---|---|---|
| 5,587,624 | A | * | 12/1996 | Komaki | 313/584 |
| 6,307,528 | B1 | * | 10/2001 | Yap | 345/45 |
| 6,452,333 | B1 | * | 9/2002 | Torisaki et al. | 313/586 |
| 6,459,208 | B2 | * | 10/2002 | Battersby | 315/169.3 |
| 2004/0004444 | A1 | * | 1/2004 | Choi et al. | 315/169.2 |
| 2005/0029944 | A1 | * | 2/2005 | Kwon et al. | 313/583 |

* cited by examiner

*Primary Examiner*—Bipin Shalwala
*Assistant Examiner*—Ilana Spar
(74) *Attorney, Agent, or Firm*—Morgan Lewis & Bockius LLP

(57) ABSTRACT

The present invention relates to a light emitting device where difference of brightness of pixels can be reduced when the same data currents are applied to the pixels. The light emitting device includes anode electrode layers, cathode electrode layers, pixels and cathode lines. The anode electrode layers are disposed in a first direction. The cathode electrode layers are disposed in a second direction. The pixels are formed in cross areas of the anode electrode layers and the cathode electrode layers. The cathode lines are coupled to the cathode electrode layers. Here, in one cathode electrode layer, at least one of resistors between parts corresponding to pixels except a first pixel next to a cathode line corresponding to the cathode electrode layer has resistance smaller than resistor between a part corresponding to the first pixel and a part corresponding to a pixel next to the first pixel.

16 Claims, 20 Drawing Sheets

[RELATED ART]

US 7,737,922 B2

LIGHT EMITTING DEVICE

BACKGROUND OF THE INVENTION

1. Field of the Invention

The present invention relates to a light emitting device. More particularly, the present invention relates to a light emitting device where difference of brightness of pixels can be reduced when data currents having the same magnitude are applied to the pixels.

2. Description of the Related Art

A light emitting device emits a light having a certain wavelength when a predetermined current or voltage is provided to the light emitting device, and especially an organic electroluminescent device is self light emitting device.

FIG. 1 is a plan view illustrating a common light emitting device.

In FIG. 1, the light emitting device includes anode electrode layers 100, cathode electrode layers 102, pixels 104, walls 106, anode lines 108, cathode lines 110A and 110B and a driver 112.

The anode electrode layers 100 are disposed in a first direction.

The cathode electrode layers 102 are disposed in a second direction different from the first direction.

The pixels 104 are formed in cross areas of the anode electrode layers 100 and the cathode electrode layers 102.

The walls 106 are made up of insulating material, and are disposed between the cathode electrode layers 102 to separate electrically the cathode electrode layers 102.

The anode lines 108 are coupled to the anode electrode layers 100.

The cathode lines 110A and 110B are coupled to the cathode electrode layers 102.

The driver 112 combines with end of the lines 108, 110A and 110B as shown in FIG. 1, and includes a driving circuit 114.

The driving circuit 114 drives the pixels 104.

FIG. 2A is a view illustrating a circuitry of the light emitting device in FIG. 1. FIG. 2B and FIG. 2C are views illustrating process of driving the light emitting device in FIG. 2A.

In FIG. 2A, the light emitting device includes the pixels E11 to E64 and the driver 112.

The driver 112 includes a controller 200, a first scan driving circuit 202, a second scan driving circuit 204 and a data driving circuit 206. Here, data lines D1 to D6 correspond to the anode electrode layers 100 and the anode lines 108, and scan lines S1 to S4 correspond to the cathode electrode layers 102 and the cathode lines 110A and 110B.

The controller 200 controls the scan driving circuits 202 and 204 and the data driving circuit 206 using display data inputted from an outside apparatus (not shown).

The first scan driving circuit 202 transmits first scan signals to some of the scan lines S1 to S4, for example S1 and S3. The second scan driving circuit 204 transmits second scan signals to the other scan lines S2 and S4. As a result, the scan lines S1 to S4 are connected in sequence to a ground as described below.

The data driving circuit 206 has a plurality of current sources CS1 to CS6, and provides data currents corresponding to the display data and outputted from the current sources CS1 to CS6 to the data lines D1 to D6. As a result, the pixels E11 to E64 emit light.

Hereinafter, a process of driving the light emitting device will be described with reference to FIG. 2A to FIG. 2C.

Firstly, as shown in FIG. 2B, a first scan line S1 of the scan lines S1 to S4 is connected to the ground, and the other scan lines S2 to S4 are connected to a non-luminescent source having a voltage V1, wherein the voltage V1 has the same magnitude as a driving voltage Vc of the light emitting device.

Subsequently, data currents I11 to I61 corresponding to a first display data are provided to the data lines D1 to D6. In this case, the data currents I11 to I61 are passed to the ground through the data lines D1 to D6, the pixels E11 to E61 and the first scan line S1. As a result, the pixels E11 to E61 related to the first scan line S1 emit light.

Then, as shown in FIG. 2C, a second scan line S2 is connected to the ground, and the other scan lines S1, S3 and S4 are connected to the non-luminescent source.

Subsequently, data currents I12 to I62 corresponding to a second display data inputted to the controller 200 after the first display data is inputted to the controller 200 are provided to the data lines D1 to D6. In this case, the data currents I12 to I62 are passed to the ground through the data lines D1 to D6, the pixels E12 to E62 and the second scan line S2. As a result, the pixels E12 to E62 corresponding to the second scan line S2 emit light.

Pixels E13 to E63 corresponding to a third scan line S3 emit light, and then pixels E14 to E64 corresponding to a fourth scan line S4 emit light through the method described above. Subsequently, the above process of emitting light in the pixels E11 to E64 is repeated in units of the scan lines S1 to S4.

Hereinafter, a process of driving the pixels E11 to E64 will be described in detail through difference of brightness between the pixels E11 and E12.

Firstly, resistors between each of the pixels E11 to E64 and the ground will be described.

Each of the cathode electrode layers 102 has a constant width through its whole area as shown in FIG. 1. Hence, in one cathode electrode layer, resistors between the pixels E11 to E64 have the same resistances. As a result, a resistor between the pixel E11 and the ground is Rs, a resistor between a pixel E21 and the ground is Rs+Rp, and a resistor between a pixel E31 and the ground is Rs+2Rp. In addition, a resistor between the pixel E41 and the ground is Rs+3Rp, a resistor between a pixel E51 and the ground is Rs+4Rp, and a resistor between a pixel E61 and the ground is Rs+5Rp Hereinafter, the data currents I11 to I61 having the same magnitude are assumed to be provided to the data lines D1 to D6 so that the pixels E11 to E61 have the same brightness.

The data currents I11 to I61 pass to the ground through corresponding pixels E11 to E61 and the first scan line S1. In this case, because the data currents I11 to I61 have the same magnitude, cathode voltages VC11 to VC61 of the pixels E11 to E61 are proportionate to resistor between corresponding pixel and the ground. Therefore, the values are high in the order of the cathode voltages VC61, VC51, VC41, VC31, VC21 and VC11. Here, brightness of the pixels E11 to E61 is affected by the cathode voltages VC11 to VC61 of the pixels E11 to E61. Generally, when data currents having the same magnitude are provided to the pixels E11 to E61, the higher the cathode voltages VC11 to VC61 are, the smaller the pixels E11 to E61 have brightness. Accordingly, when the data currents having the same magnitude are provided to the pixels E11 to E61, the pixel E11 related to the smallest resistor of resistors corresponding to the pixels E11 to E61 emits a light having the highest brightness. However, the pixel E61 related to the highest resistor of the resistors emits a light having the smallest brightness.

In short, when the data currents I11 to I61 having the same magnitude are provided to the pixels E11 to E61, the brightness of the pixels E11 to E61 is governed by the resistors between each of the pixels E11 to E61 and the ground.

In FIG. 2C, a resistor between a pixel E12 and the ground is Rs+5Rp. Accordingly, the pixel E12 of the pixels E12 to E62 corresponding to the second scan line S2 emits a light having the smallest brightness.

Hereinafter, the pixels E11 and E12 will be compared.

The resistor between the pixel E11 and the ground is Rs, but the resistor between the pixel E12 and the ground is Rs+5Rp. Hence, when pixels E11 and E12 are preset to have the same brightness, i.e. the data currents I11 and I12 having the same magnitude are provided to the pixels E11 and E61, the pixel E11 emits a light having brightness higher than the pixel E12. In this case, the pixel E12 is located next to the pixel E11, and so difference of brightness of the pixels E11 and E12 is sensed by a user.

In brief, in the light emitting device, though pixels are preset to have the same brightness, difference of brightness between the pixels is generated. In addition, the difference of brightness of the pixels E11 to E12 may be sensed by the user.

SUMMARY OF THE INVENTION

It is a feature of the present invention to provide a light emitting device where difference of brightness between pixels is reduced.

A light emitting device according to one embodiment of the present invention includes anode electrode layers, cathode electrode layers, pixels and cathode lines. The anode electrode layers are disposed in a first direction. The cathode electrode layers are disposed in a second direction different from the first direction. The pixels are formed in cross areas of the anode electrode layers and the cathode electrode layers. The cathode lines are coupled to the cathode electrode layers. Here, in one cathode electrode layer, at least one of resistors between parts corresponding to pixels except a first pixel next to a cathode line corresponding to the cathode electrode layer has resistance smaller than resistor between a part corresponding to the first pixel and a part corresponding to a pixel next to the first pixel.

A light emitting device according to another embodiment of the present invention includes anode electrode layers, cathode electrode layers and pixels. The anode electrode layers are disposed in a first direction. The cathode electrode layers are disposed in a second direction different from the first direction. The pixels are formed in first cross area of one anode electrode layer of the anode electrode layers and one cathode electrode layer and second cross areas of other anode electrode layers and the cathode electrode layer. Here, at least one of the second cross areas is wider than the first cross area.

As described above, the light emitting device of the present invention changes the width of cathode electrode layer to reduce difference of brightness between pixels corresponding to the cathode electrode layer, and so the difference of brightness of the pixels is not sensed by the user.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Hereinafter, the preferred embodiments of the present invention will be explained in more detail with reference to the accompanying drawings.

Figure 1:
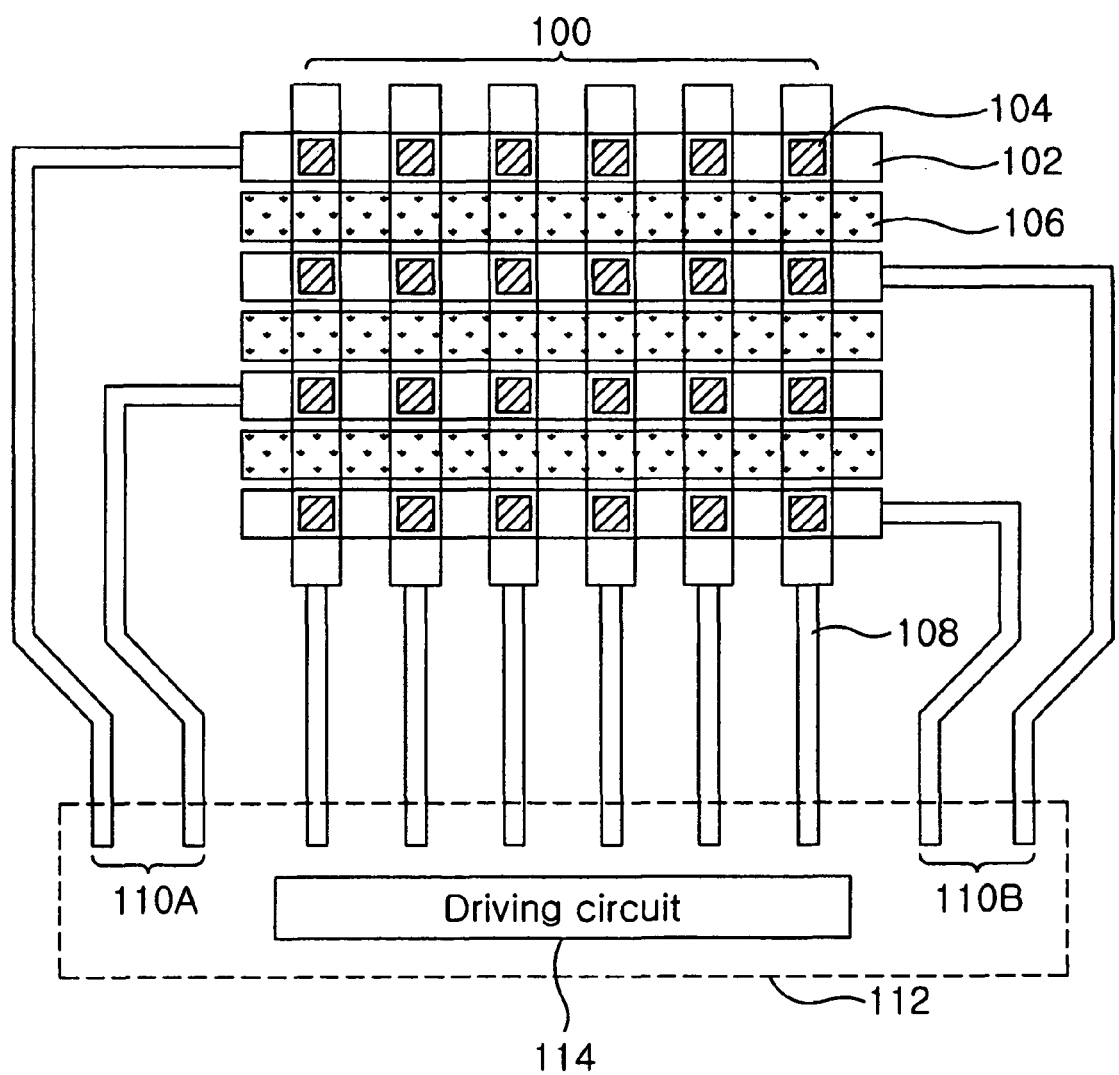
FIG. 1 is a plan view illustrating a common light emitting device.
Figure 2A:
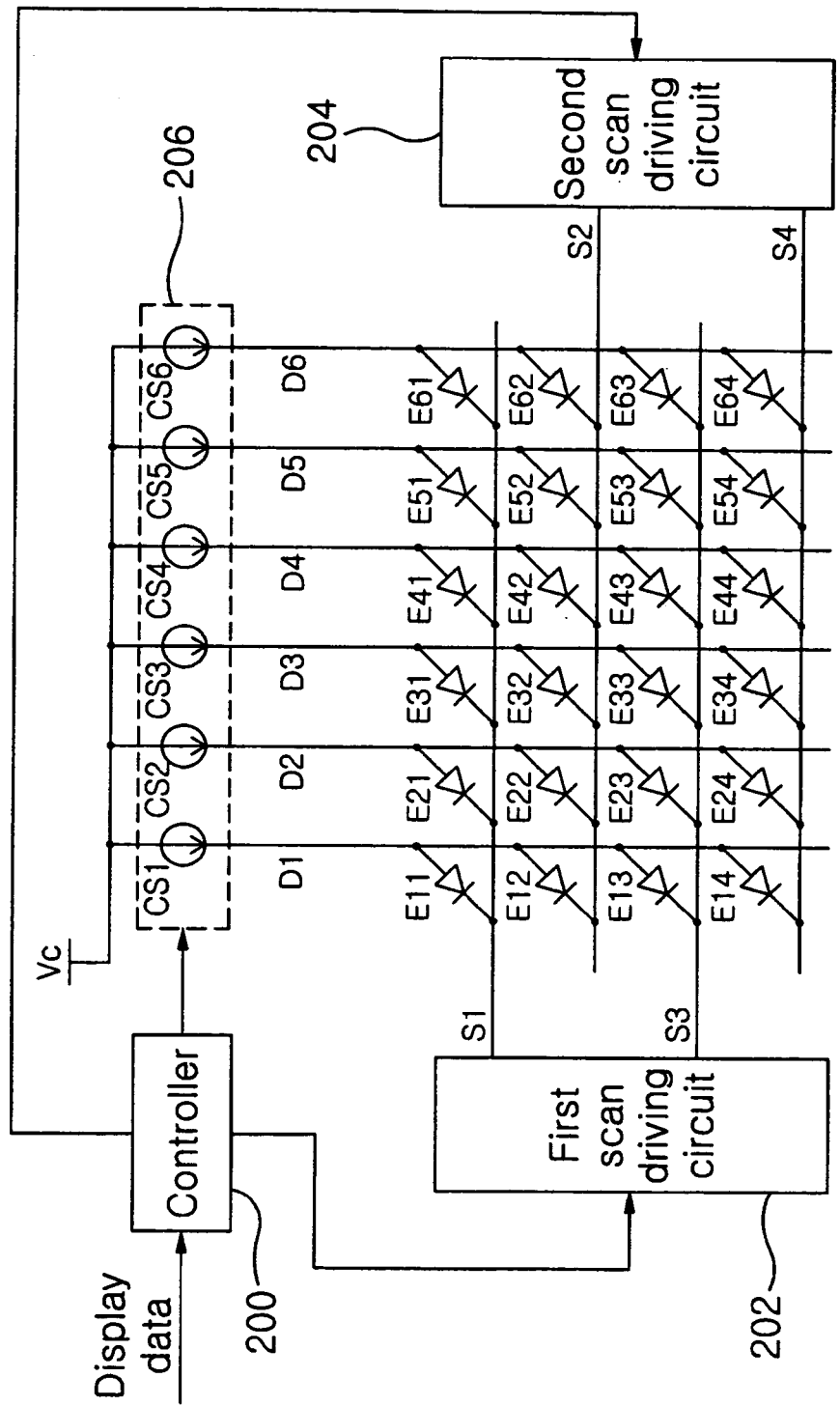
FIG. 2A is a view illustrating a circuitry of the light emitting device in FIG. 1.
Figure 2B:
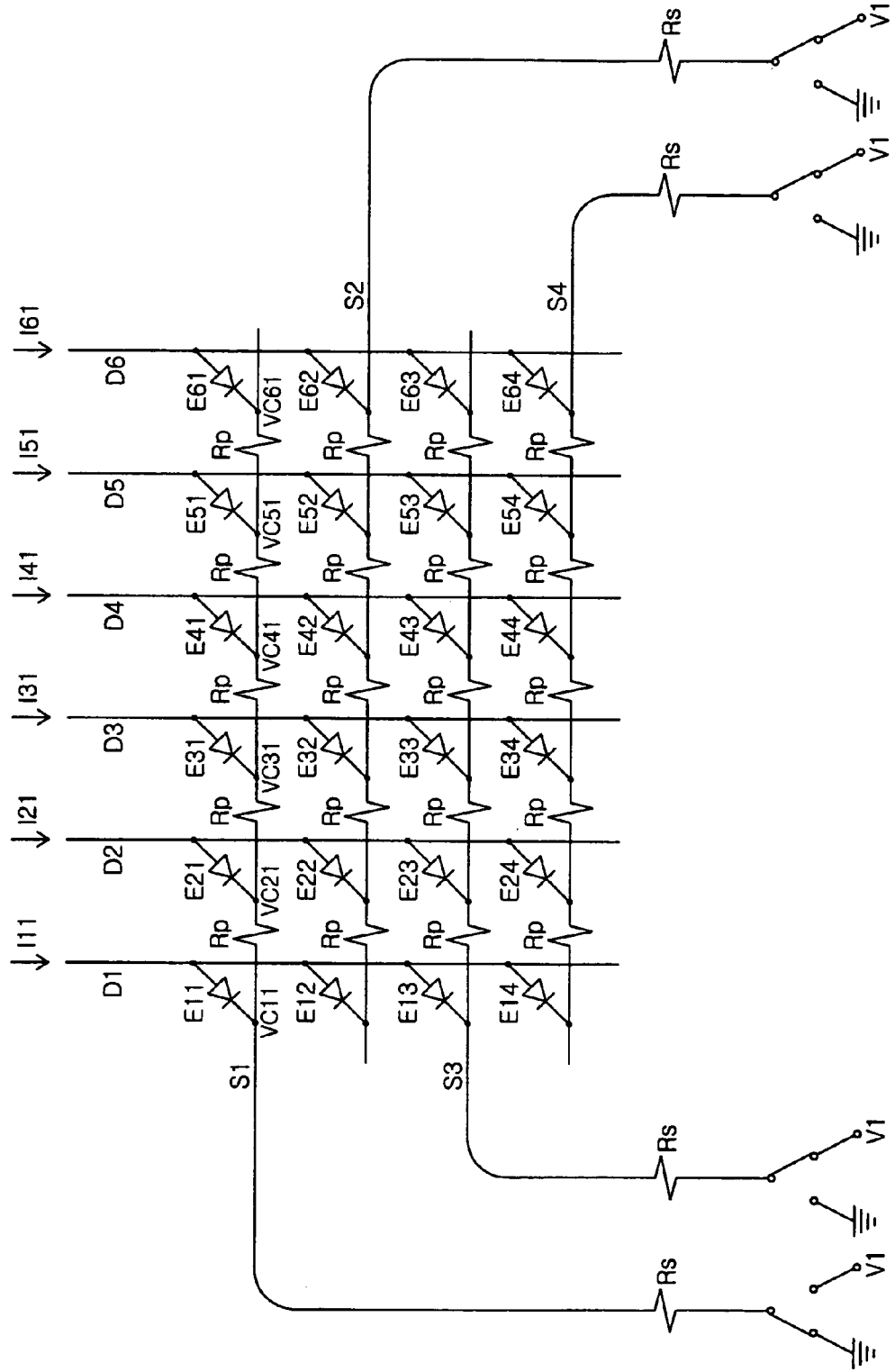
FIG. 2B and FIG. 2C are views illustrating process of driving the light emitting device in FIG. 2A.
Figure 2C:
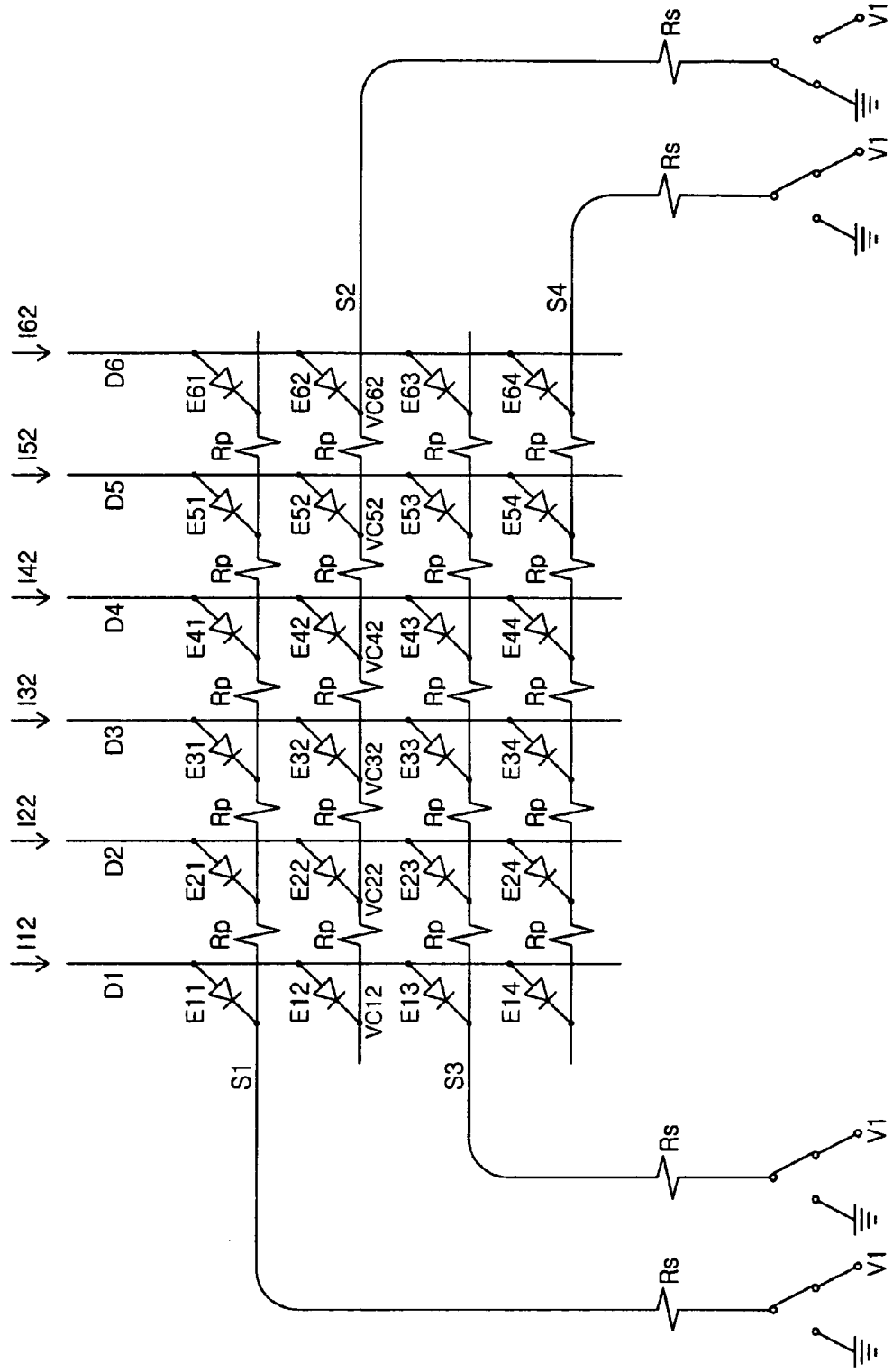
Figure 3:
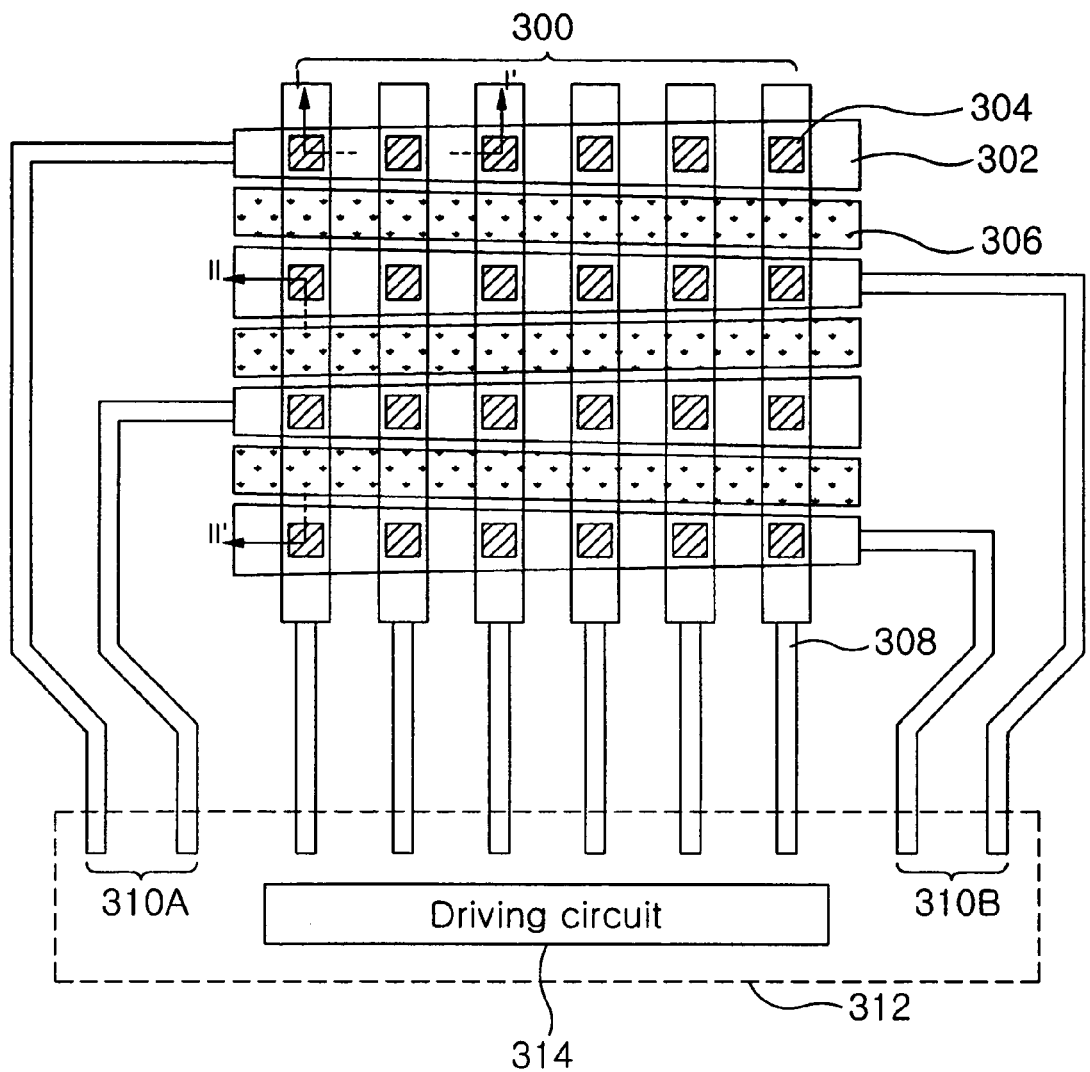
FIG. 3 is a plan view illustrating a light emitting device according to a first embodiment of the present invention.

FIG. 3 is a plan view illustrating a light emitting device according to a first embodiment of the present invention.

In FIG. 3, the light emitting device of the present invention includes anode electrode layers 300, cathode electrode layers 302, pixels 304, walls 306, anode lines 308, cathode lines 310A and 310B and a driver 312.

The light emitting device according to one embodiment of the present invention includes an organic electroluminescent device, a plasma display panel, a liquid crystal display, and others. Hereinafter, the organic electroluminescent device will be described as an example of the light emitting device for convenience of the description.

The anode electrode layers 300 as transparent electrode are disposed in a first direction, and are made up of indium tin oxide, etc.

The cathode electrode layers 302 are disposed in a second direction different from the first direction, and are made up of metal such as aluminum Al, and so on. Additionally, the width of each of the cathode electrode layers 302 is increased in a certain direction as shown in FIG. 3.

The pixels 304 are formed in cross areas of the anode electrode layers 300 and the cathode electrode layers 302.

In case that the light emitting device is organic electroluminescent device, each of the pixels 304 is made up of the anode electrode layer, an organic layer and the cathode electrode layer formed in sequence on a substrate. When certain positive voltage and negative voltage are provided to the anode electrode layer and the cathode electrode layer, the organic layer emits a light having a certain wavelength.

The walls 306 are made up of insulating material, and are disposed between the cathode electrode layers 302 to separate electrically the cathode electrode layers 302.

The anode lines 308 are coupled to the anode electrode layers 300.

First cathode lines 310A are coupled to some of the cathode electrode layers 302, and second cathode lines 310B are coupled to the other cathode electrode layers.

The driver 312 combines with the end of the lines 308, 310A and 310B, and includes a driving circuit 314.

The driving circuit 314 drives the pixels 304 as described below.

In short, in one cathode electrode layer, its width is increased in a direction of a second end from a first end coupled to cathode line related thereto. Accordingly, in the cathode electrode layer, resistances of the resistors corresponding to pixels related to the cathode electrode layer are reduced in a direction of the second end from the first end. This will be described with reference to the accompanying drawings.

Figure 4A:
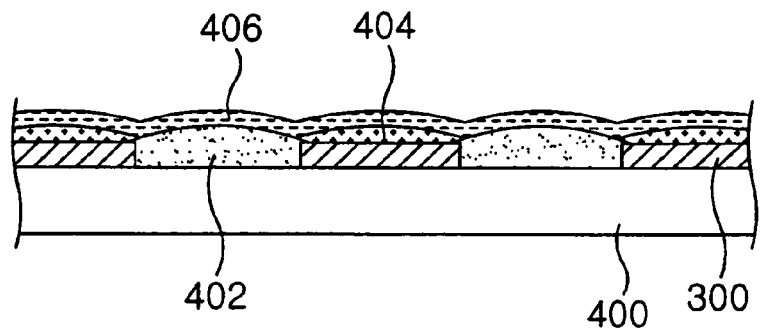
FIG. 4A is a sectional view illustrating the light emitting device taken along line of I-I' in FIG. 3 according to one embodiment of the present invention.

FIG. 4A is a sectional view illustrating the light emitting device taken along line of I-I' in FIG. 3 according to one embodiment of the present invention.

In FIG. 4A, the anode electrode layers 300 are formed on a substrate 400 with a predetermined pattern.

Organic layers 404 are formed on the anode electrode layers 300.

In addition, insulating films 402 are formed between the anode electrode layers 300 to separate electrically the anode electrode layers 300.

Metal material layer 406 including metal material is formed on the organic layers 404 and the insulating films 402. Here, part corresponding to the anode electrode layers 300 and the organic layers 404 of the metal material layer 406 is cathode electrode layers 302.

Figure 4B:
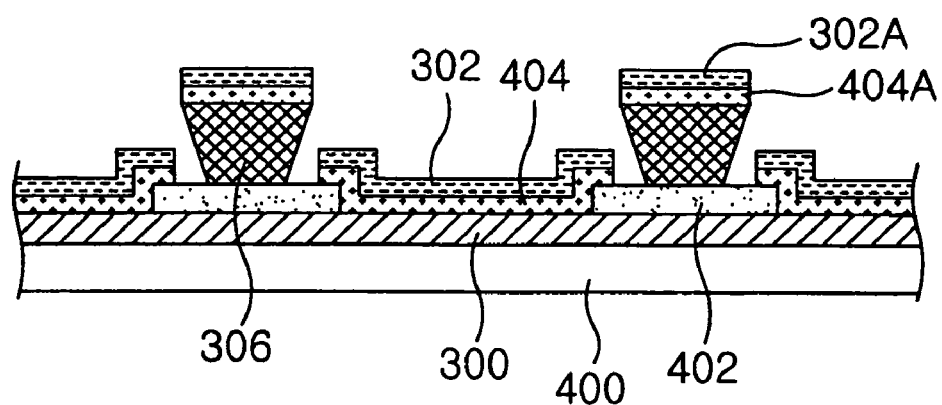
FIG. 4B is a sectional view illustrating the light emitting device taken by line of II-II' in FIG. 3 according to one embodiment of the present invention.

FIG. 4B is a sectional view illustrating the light emitting device taken by line of II-II' in FIG. 3 according to one embodiment of the present invention.

In FIG. 4B, the anode electrode layer 300, the organic layer 404 and the cathode electrode layer 302 are formed in sequence on the substrate 400. Here, when certain positive voltage and negative voltage are provided to the anode electrode layer 300 and the cathode electrode layer 302, respectively, the organic layer 404 emits a light having a certain wavelength.

The walls 306 are formed on the insulating film 402, thereby separating electrically the cathode electrode layers 302.

Figure 5A:
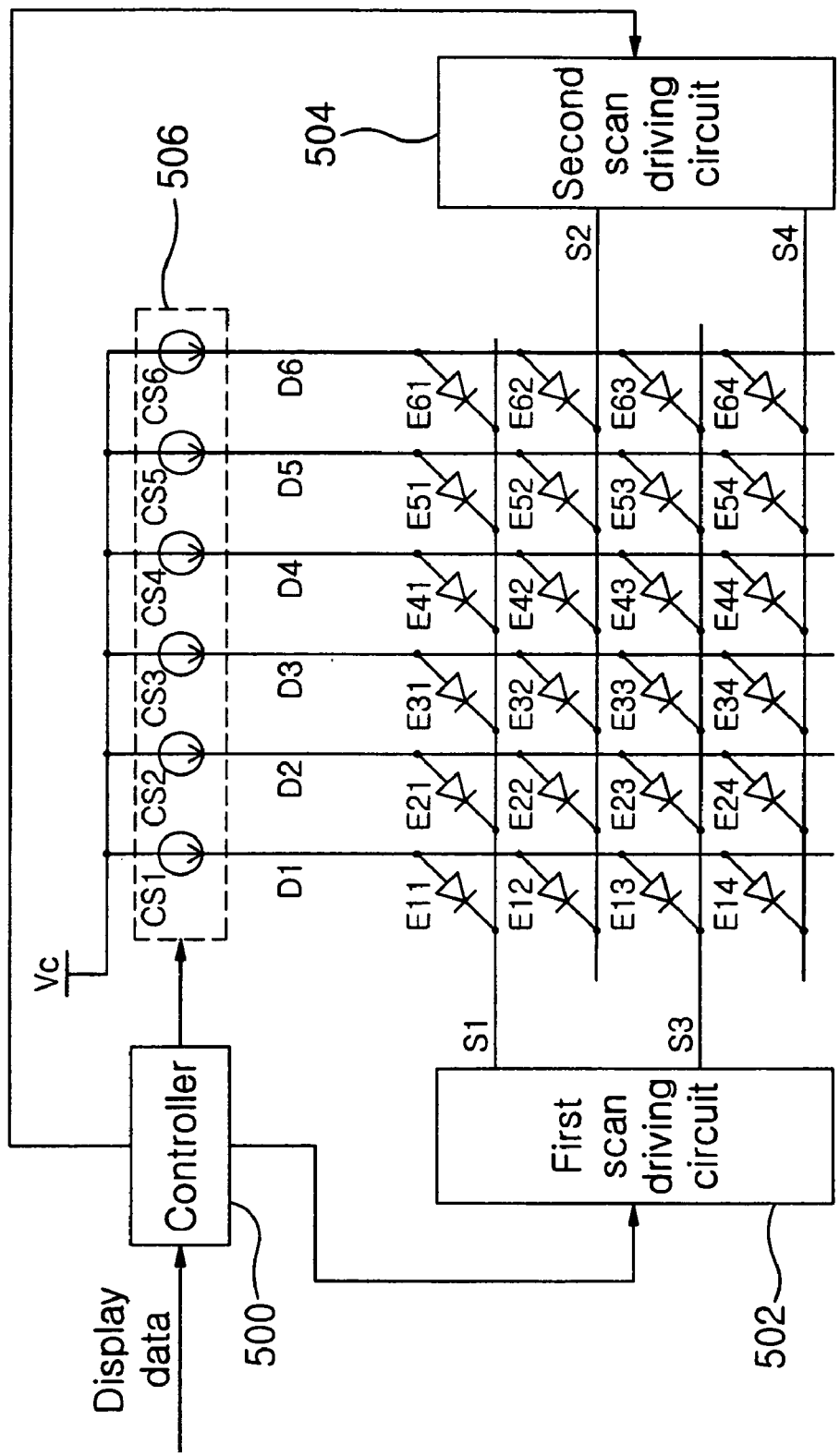
FIG. 5A is a view illustrating a circuitry of the light emitting device in FIG. 3 according to one embodiment of the present invention.

FIG. 5A is a view illustrating a circuitry of the light emitting device in FIG. 3 according to one embodiment of the present invention.

In FIG. 5A, the light emitting device of the present invention includes pixels E11 to E64 and the driver 312.

The driver 312 includes a controller 500, a first scan driving circuit 502, a second scan driving circuit 504 and a data driving circuit 506. Here, data lines D1 to D6 correspond to the anode electrode layers 300 and the anode lines 308, and scan lines S1 to S4 correspond to the cathode electrode layers 302 and the cathode lines 310A and 310B.

The controller 500 controls the scan driving circuits 502 and 504 and the data driving circuit 506 by using display data inputted from an outside apparatus (not shown).

The first scan driving circuit 502 provides first scan signals to some of the scan lines S1 to S4, e.g. S1 and S3. The second scan driving circuit 504 provides second scan signals to the other scan lines S2 and S4. As a result, the scan lines S1 to S4 are coupled in sequence to a luminescent-source.

The data driving circuit 506 includes a plurality of current sources CS1 to CS6, and provides data currents corresponding to the display data and outputted from the current sources CS1 to CS6 to the data lines D1 to D6 under control of the controller 500. As a result, the pixels E11 to E64 emit light.

Hereinafter, a process of driving the light emitting device will be described in detail with reference to FIG. 5B and FIG. 5C.

Figure 5B:
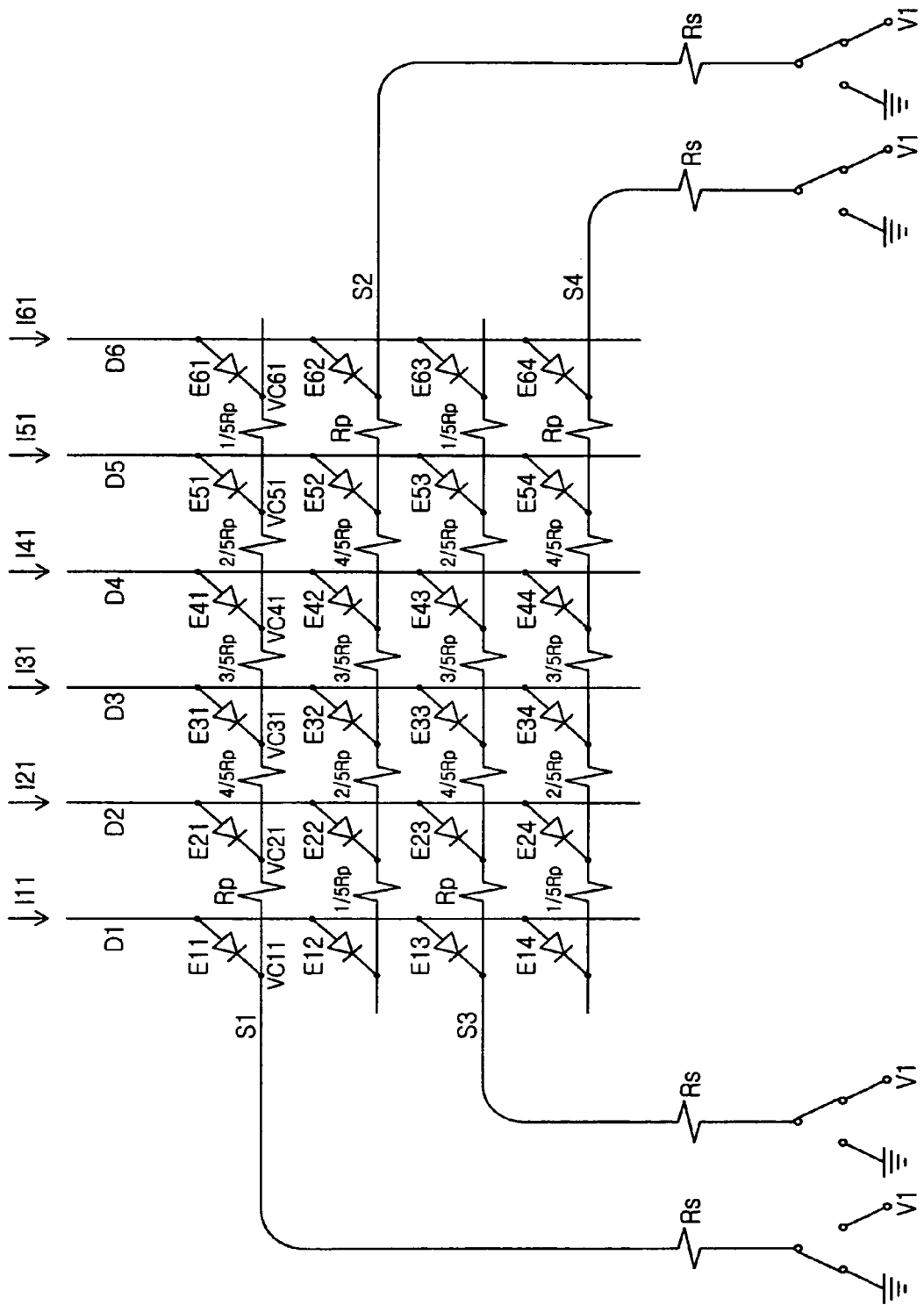
FIG. 5B and FIG. 5C are views illustrating a process of driving the light emitting device according to one embodiment of the present invention.
Figure 5C:
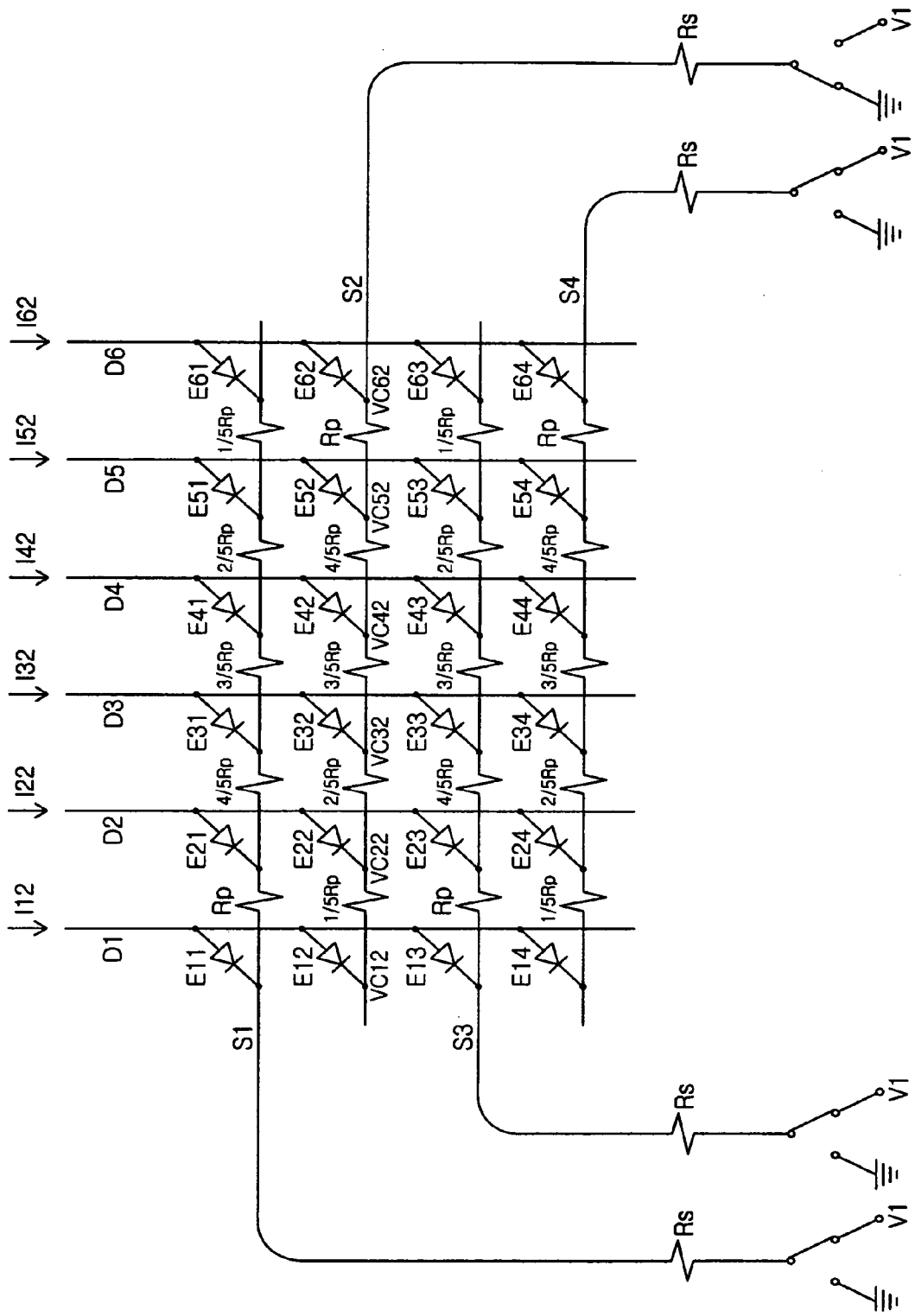

FIG. 5B and FIG. 5C are views illustrating a process of driving the light emitting device according to one embodiment of the present invention.

Firstly, a first scan line S1 of the scan lines S1 to S4 is coupled to a luminescent-source, preferably ground as shown in FIG. 5B. The other scan lines S2 to S4 are coupled to a non-luminescent source having voltage V1, wherein the voltage V1 has the same magnitude as a driving voltage Vc of the light emitting device. Hereinafter, the luminescent-source is assumed by the ground.

Subsequently, data currents I11 to I61 corresponding to first display data are provided to the data lines D1 to D6. In this case, the data currents I11 to I61 are passed to the ground through the data lines D1 to D6, the pixels E11 to E61 and the first scan line S1. As a result, the pixels E11 to E61 corresponding to the first scan line S1 emit light.

Then, a second scan line S2 of the scan lines S1 to S4 is coupled to the ground, and the other scan lines S1, S3 and S4 are coupled to the non-luminescent source.

Subsequently, data currents I12 to I62 corresponding to second display data inputted to the controller 500 after the first display data is inputted to the controller 500 are provided to the data lines D1 to D6 as shown in FIG. 5C. In this case, the data currents I12 to I62 are passed to the ground through the data lines D1 to D6, the pixels E12 to E62 and the second scan line S2. As a result, the pixels E12 to E62 corresponding to the second scan line S2 emit light.

Pixels E13 to E63 corresponding to a third scan line S3 emit light, and then pixels E14 to E64 corresponding to a fourth scan line S4 emit light through the method described above. Subsequently, the above process of emitting light in the pixels E11 to E64 is repeated in units of the scan lines S1 to S4.

Hereinafter, a process of driving the pixels E11 to E64 will be described in detail through difference of brightness between the pixels E11 and E12.

Firstly, resistors between each of the pixels E11 to E64 and the ground will be described.

In one cathode electrode layer, its width is increased in a direction of its second end from its first end coupled to corresponding cathode line as shown in FIG. 3. Hence, in the cathode electrode layer, resistors between parts corresponding to the pixels related the cathode electrode layer are reduced in a direction of the second end from the first end as shown in FIG. 5B.

For example, a resistor between the pixel E11 and the ground is Rs, a resistor between a pixel E21 and the ground is Rs+Rp, and a resistor between a pixel E31 and the ground is Rs+1.8Rp. In addition, a resistor between the pixel E41 and the ground is Rs+2.4Rp, a resistor between a pixel E51 and the ground is Rs+2.8Rp, and a resistor between a pixel E61 and the ground is Rs+3Rp.

In FIG. 5C, a resistor between a pixel E12 and the ground is Rs+3Rp.

Hereinafter, brightness of pixels E11 and E61 will be compared.

In the light emitting device of the present invention, the resistor between the pixel E11 and the ground is Rs, and the resistor between the pixel E61 and the ground is Rs+3Rp.

Here, brightness of the pixels E11 and E61 is affected by the cathode voltages VC11 and VC61 of the pixels E11 and E61. Additionally, the cathode voltages VC11 and VC61 are proportionate to resistances of the resistors between the each of pixels E11 and E61 and the ground when the data currents I11 and I61 have the same magnitude. Accordingly, the brightness of the pixels E11 and E61 is governed by the resistors between each of the pixels E11 and E61 and the ground when the data currents I11 to I61 have the same magnitude.

In the above case, the first resistor between the pixel E61 and the ground is higher than the second resistor between the pixel E11 and the ground, and so the pixel E61 emits a light having brightness smaller than the pixel E11 when the data currents I11 and I61 have the same magnitude.

However, difference of the first resistor and the second resistor is 3Rp, and thus the difference of the first resistor and the second resistor is smaller than that (5A) of the resistors in the light emitting device described in Related Art. Accordingly, the difference of brightness of the pixels E11 and E61 may be not sensed by a user. Especially, in case that size of the light emitting device is increased, i.e. number of pixels is increased, difference of brightness of the pixels in the light emitting device of the present invention may be much smaller than that in the light emitting device described in Related Art.

Hereinafter, brightness of pixels E11 and E12 will be compared.

The resistor between the pixel E11 and the ground is Rs, and the resistor between the pixel E12 and the ground is Rs+3Rp. Accordingly, the pixel E12 emits a light having brightness smaller than the pixel E11. However, difference of the resistors is small, and so difference of brightness of the pixels E11 and E12 is not sensed by the user when the data currents I11 and I12 have the same magnitude.

In brief, in the light emitting device of the present invention, width of each of the cathode electrode layers 302 is increased in a predetermined direction so that the difference of brightness of the pixels E11 to E64 is not sensed by the user. This changing degree of width of the cathode electrode layers 302 may be determined by an experiment.

In the light emitting device according to another embodiment of the present invention, width of the wall 306 is changed in accordance with its position.

Figure 6A:
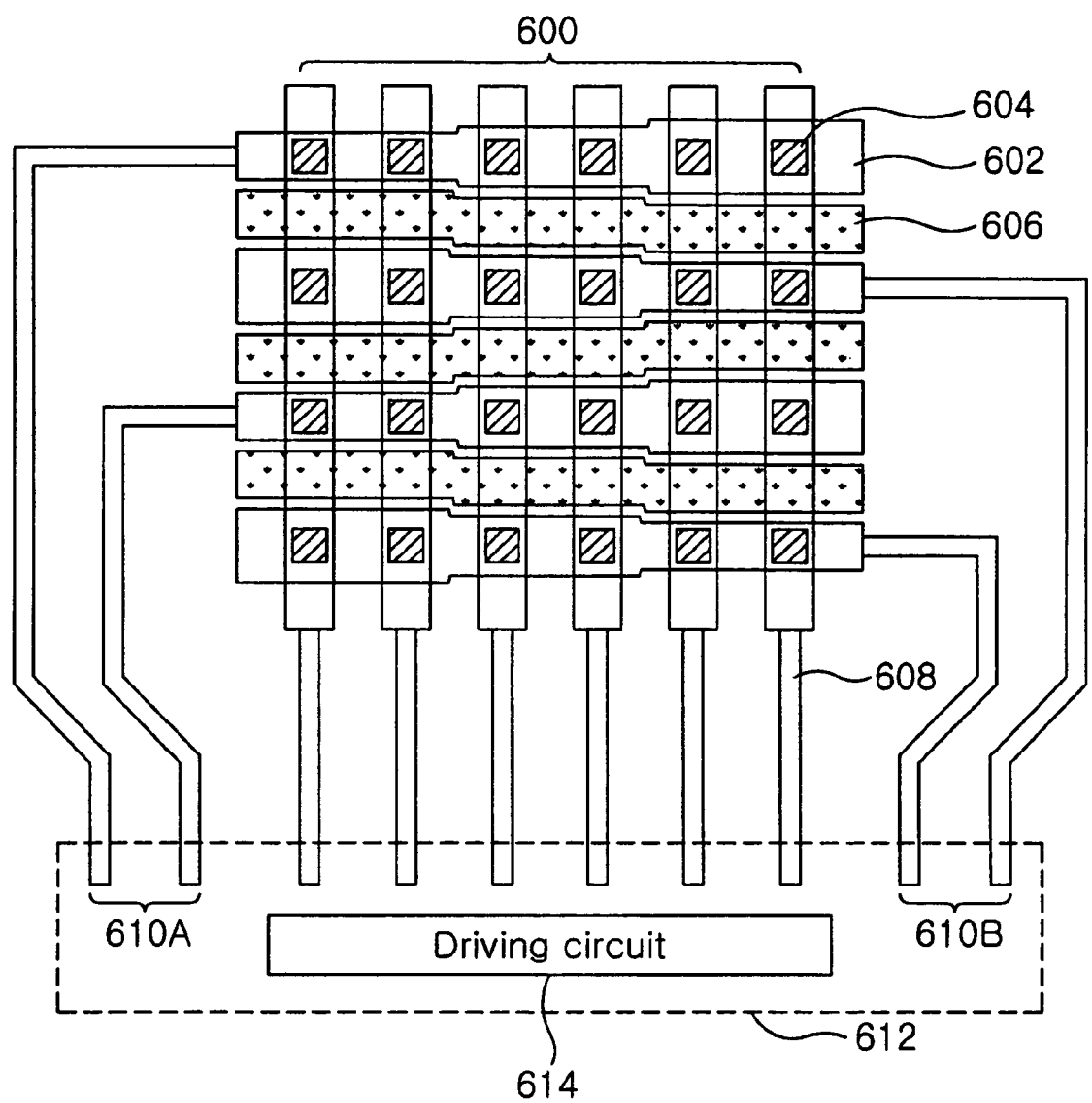
FIG. 6A is a plan view illustrating a light emitting device according to a second embodiment of the present invention.
Figure 6B:
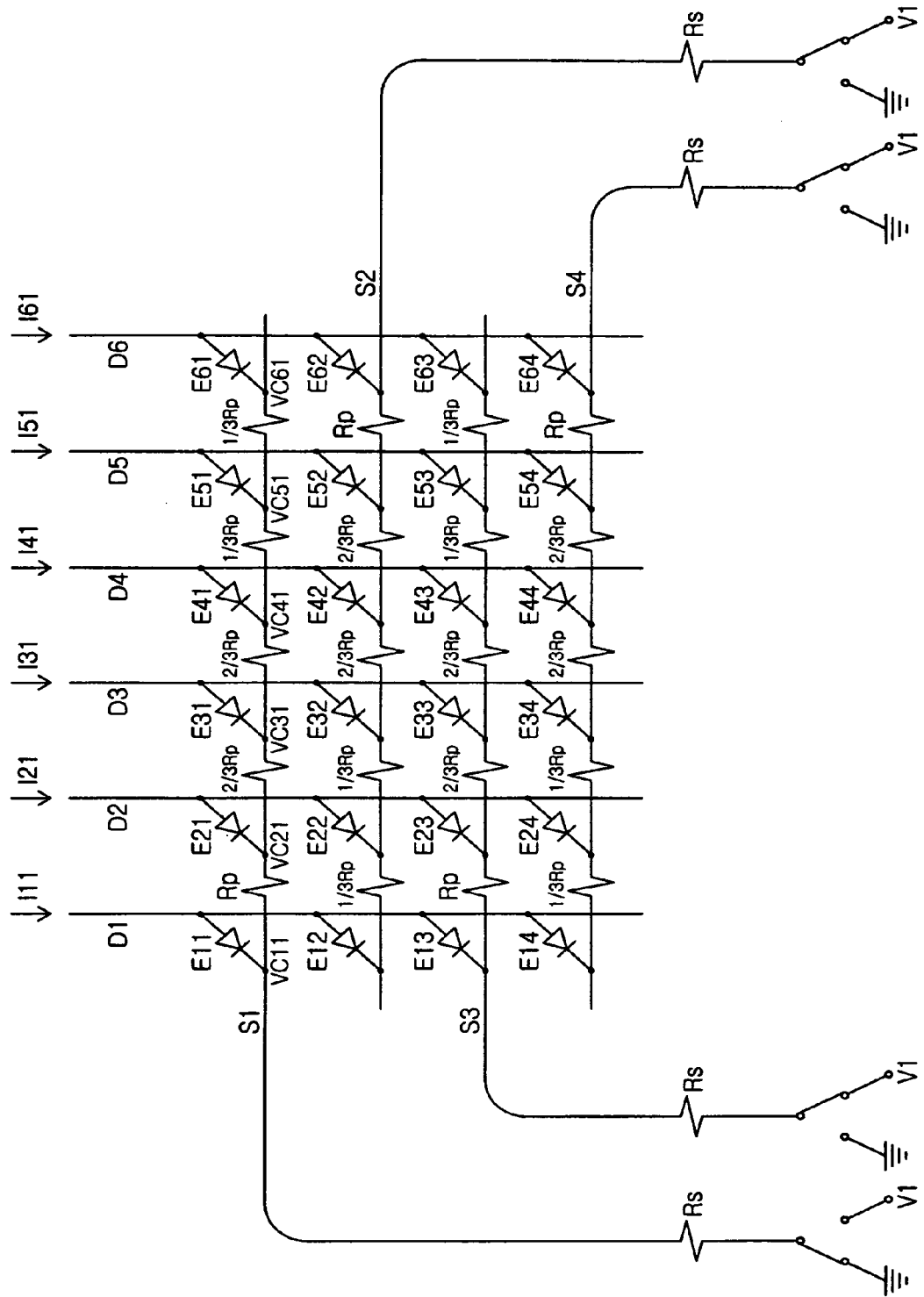
FIG. 6B is a view illustrating a circuitry of the light emitting device in FIG. 6A.

FIG. 6A is a plan view illustrating a light emitting device according to a second embodiment of the present invention. FIG. 6B is a view illustrating a circuitry of the light emitting device in FIG. 6A.

In FIG. 6A, the light emitting device of the present invention includes anode electrode layers 600, cathode electrode layers 602, pixels 604, walls 606, anode lines 608, cathode lines 610A and 610B and a driver 612.

Since the elements of the present embodiment except the cathode electrode layers 602 are the same as in the first embodiment, any further description concerning the same elements will be omitted.

Unlike the first embodiment, width of the cathode electrode layers 602 is increased in units of N (integer of above 2) anode electrode layers in a predetermined direction. For example, the width of the cathode electrode layers 602 is increased in units of two anode electrode layers as shown in FIG. 6A. As a result, the light emitting device has resistors as shown in FIG. 6B.

In FIG. 6B, a second resistor between a pixel E61 and a ground is higher than a first resistor between a pixel E11 and the ground by 3Rp.

In addition, a third resistor between a pixel E12 and the ground is higher than the first resistor by 3Rp.

Hence, difference of brightness of the pixels E11, E61 and E12 may be not sensed by a user when the data currents I11, I61 and I12 have the same magnitude. In other words, the difference of the brightness of the pixels E11, E61 and E12 having highest brightness difference is not sensed by the user, and thus difference of brightness between the other pixels is not sensed by the user.

In brief, in the light emitting device of the present invention, width of the cathode electrode layers 602 is increased in a certain unit so that the difference of brightness of the pixels E11 to E64 is not sensed by the user.

Figure 7A:
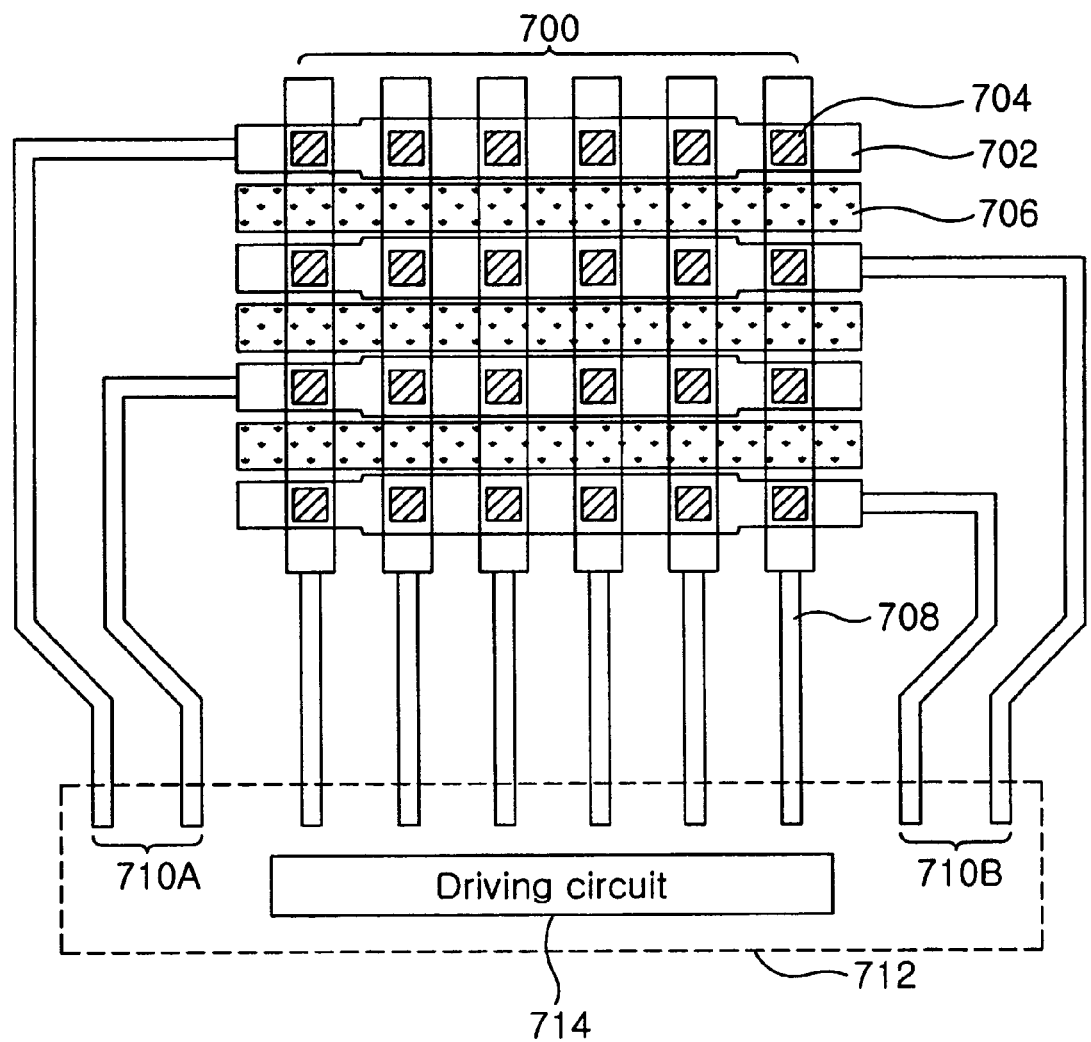
FIG. 7A is a view illustrating a light emitting device according to a third embodiment of the present invention.
Figure 7B:
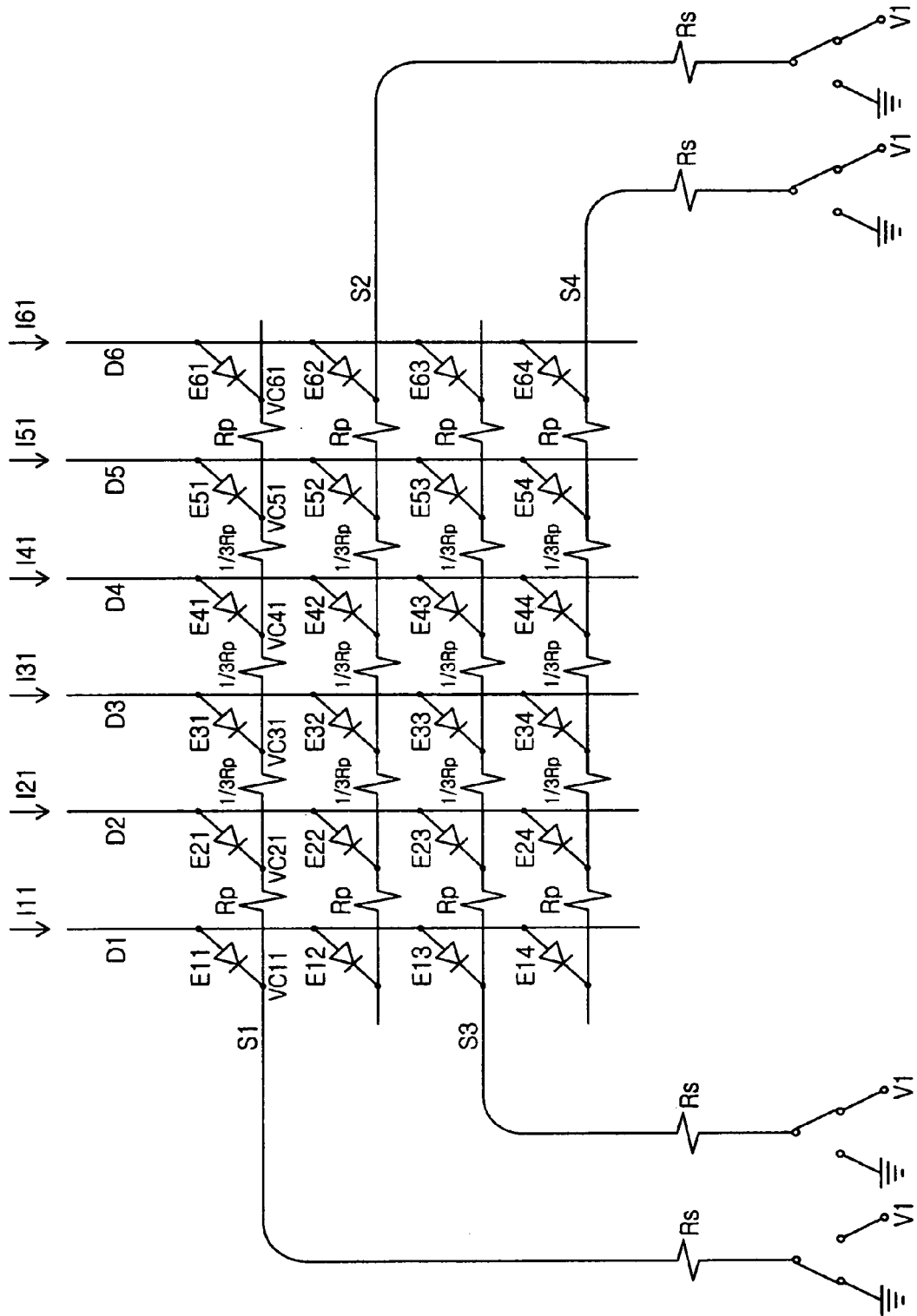
FIG. 7B is a view illustrating a circuitry of the light emitting device in FIG. 7A.

FIG. 7A is a view illustrating a light emitting device according to a third embodiment of the present invention. FIG. 7B is a view illustrating a circuitry of the light emitting device in FIG. 7A.

In FIG. 7A, the light emitting device of the present invention includes anode electrode layers 700, cathode electrode layers 702, pixels 704, walls 706, anode lines 708, cathode lines 710A and 710B and a driver 712.

Since the elements of the present embodiment except the cathode electrode layers 702 are the same as in the first embodiment, any further description concerning the same elements will be omitted.

In each of the cathode electrode layers 702, width of its ends is small, but width of other parts is higher than that of the ends. As a result, the light emitting device has resistors as shown in FIG. 7B.

In FIG. 7B, a first resistor between the pixel E11 and a ground is smaller than a second resistor between the pixel E61 and the ground by 3Rp. In addition, a third resistor between a pixel E12 and the ground is higher than the first resistor by 3Rp. Accordingly, in case that the data currents I11, I61 and I12 have the same magnitude, difference of brightness of the pixels E11, E61 and E12 may not be sensed by a user.

In short, in the light emitting device in the third embodiment unlike the first and second embodiments, width of cathode electrode layer is not increased in certain units, but center of the cathode electrode layer is wider comparing to the ends, thereby reducing difference of resistors corresponding to the pixels E11 to E64. As a result, difference of brightness of the pixels E11 to E64 is not sensed by the user.

As you know through the first to third embodiments, the light emitting device of the present invention changes width of the cathode electrode layers 302, 602 and 702 to reduce difference of brightness of the pixels E11 to E64. Preferably, each of the cathode electrode layers 302, 602 and 702 has other part wider than its end. In other words, in one cathode electrode layer, at least one of resistors corresponding to other parts except the end has resistance smaller than resistor corresponding to the end based on the same square.

Additionally, in the first to third embodiments, the walls 306, 606 and 706 have constant width. However, width of the walls 306, 606 and 706 may be changed only if the walls 306, 606 and 706 separate electrically the cathode electrode layers 302, 602 and 702.

Figure 8:
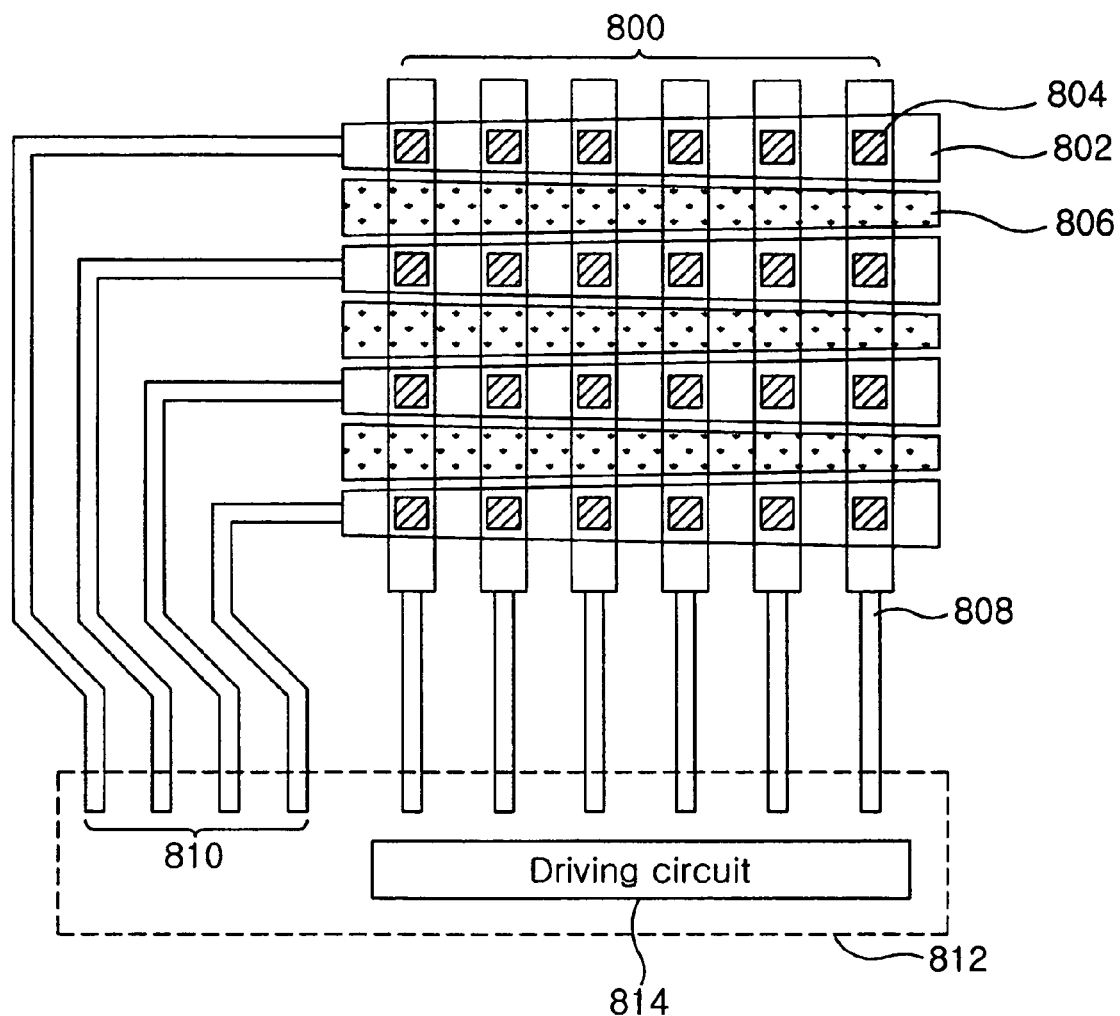
FIG. 8 is a plan view illustrating a light emitting device according to a fourth embodiment of the present invention.

FIG. 8 is a plan view illustrating a light emitting device according to a fourth embodiment of the present invention.

Figure 9A:
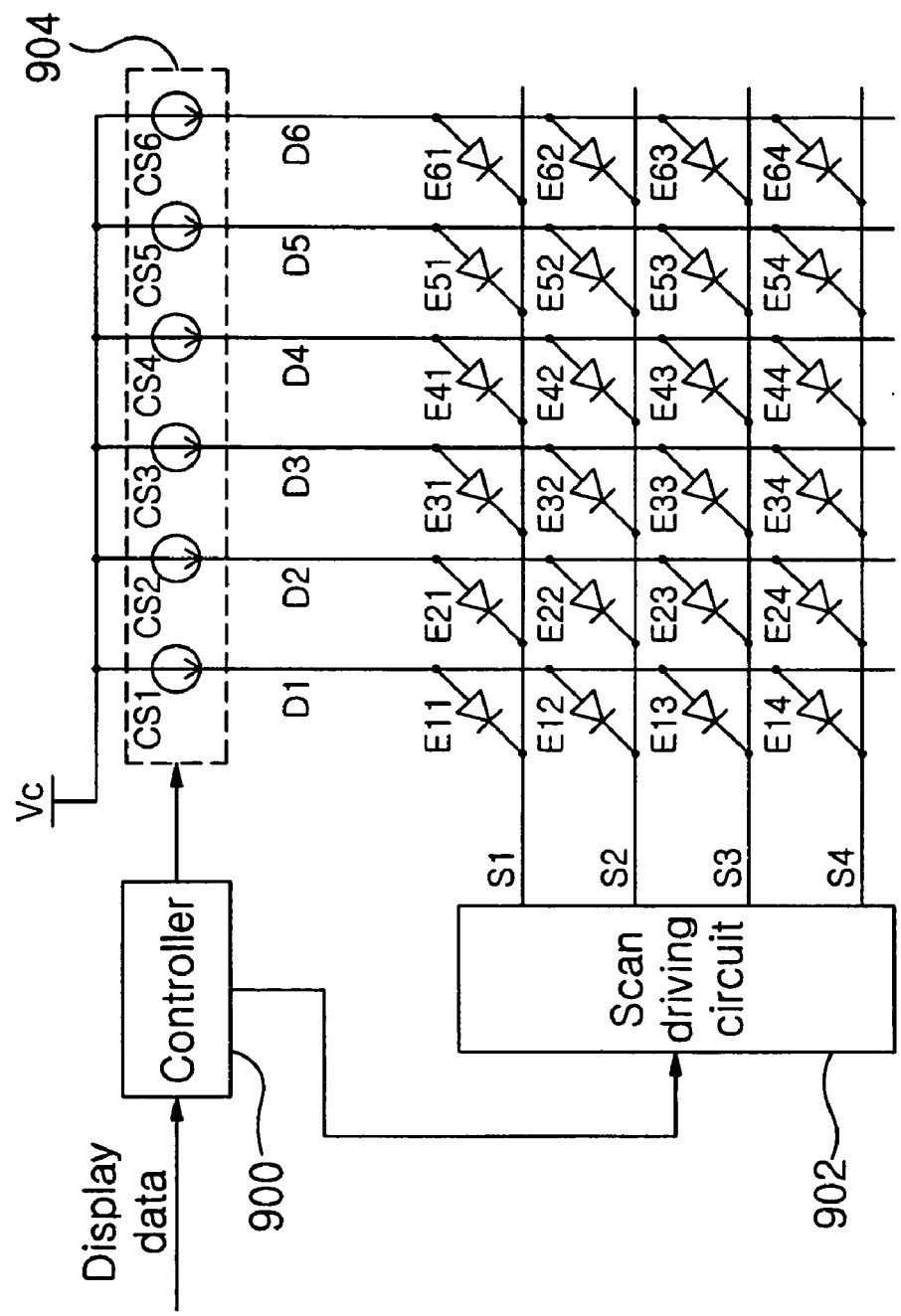
FIG. 9A is a view illustrating a circuitry of the light emitting device in FIG. 8 according to one embodiment of the present invention.
Figure 9B:
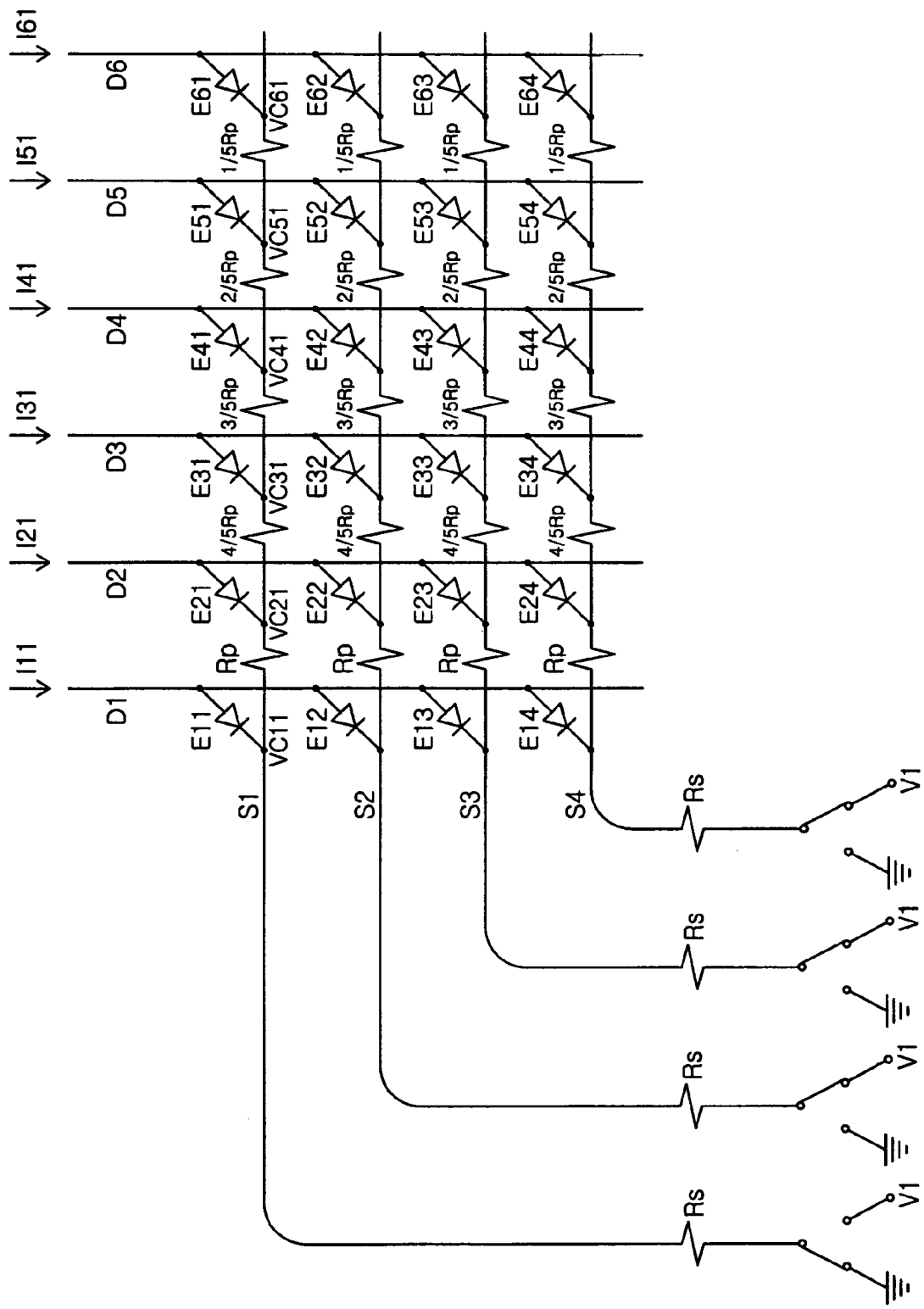
FIG. 9B is a view illustrating a process of driving the light emitting device according to one embodiment of the present invention.

FIG. 9A is a view illustrating a circuitry of the light emitting device in FIG. 8 according to one embodiment of the present invention. FIG. 9B is a view illustrating a process of driving the light emitting device according to one embodiment of the present invention.

In FIG. 8, the light emitting device of the present invention includes anode electrode layers 800, cathode electrode layers 802, pixels 804, walls 806, anode lines 808, cathode lines 810 and a driver 812.

Since the elements of the present embodiment except the cathode electrode layers 802, the walls 806 and the cathode lines 810 are the same as in the first embodiment, any further description concerning the same elements will be omitted.

The cathode lines 810 unlike the cathode lines 310A and 310B in the first embodiment are coupled to the cathode electrode layers 802 in one direction.

Width of one cathode electrode layer is increased in a direction of a second end from a first end coupled to corresponding cathode line, and so the light emitting device has resistors as shown in FIG. 9B.

The walls 806 are disposed between the cathode electrode layers 802 to separate electrically the cathode electrode layers 802. Here, width of the walls 806 is changed depending on disposition of the cathode electrode layers 802. The walls 806 according to another embodiment of the present invention may have a constant width irrespective of the disposition of the cathode electrode layers 802.

Hereinafter, the constitution of the light emitting device in the fourth embodiment will be described in detail.

In FIG. 9A, the light emitting device of the present invention includes pixels E11 to E64 and the driver 812.

The driver 812 includes a controller 900, a scan driving circuit 902 and a data driving circuit 904. Here, the data lines D1 to D6 correspond to the anode electrode layers 800 and the anode lines 808, and the scan lines S1 to S4 correspond to the cathode electrode layers 802 and the cathode lines 810.

Since the elements of the present embodiment except the scan driving circuit 902 are the same as in the first embodiment, any further description concerning the same elements will be omitted.

The scan driving circuit 902 is coupled to the scan lines S1 to S4 in one direction, and provides scan signals to the scan lines S1 to S4.

Figure 10A:
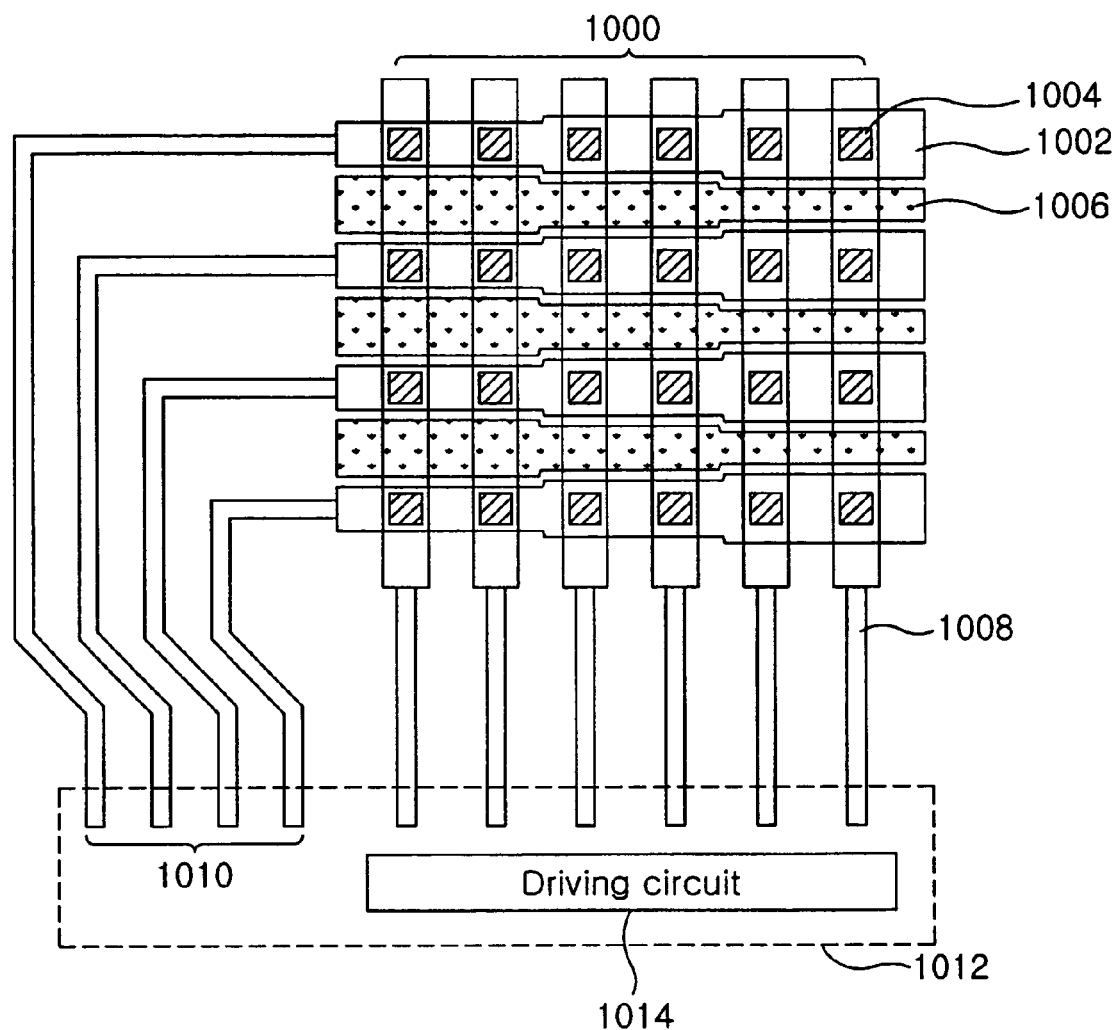
FIG. 10A is a plan view illustrating a light emitting device according to a fifth embodiment of the present invention.
Figure 10B:
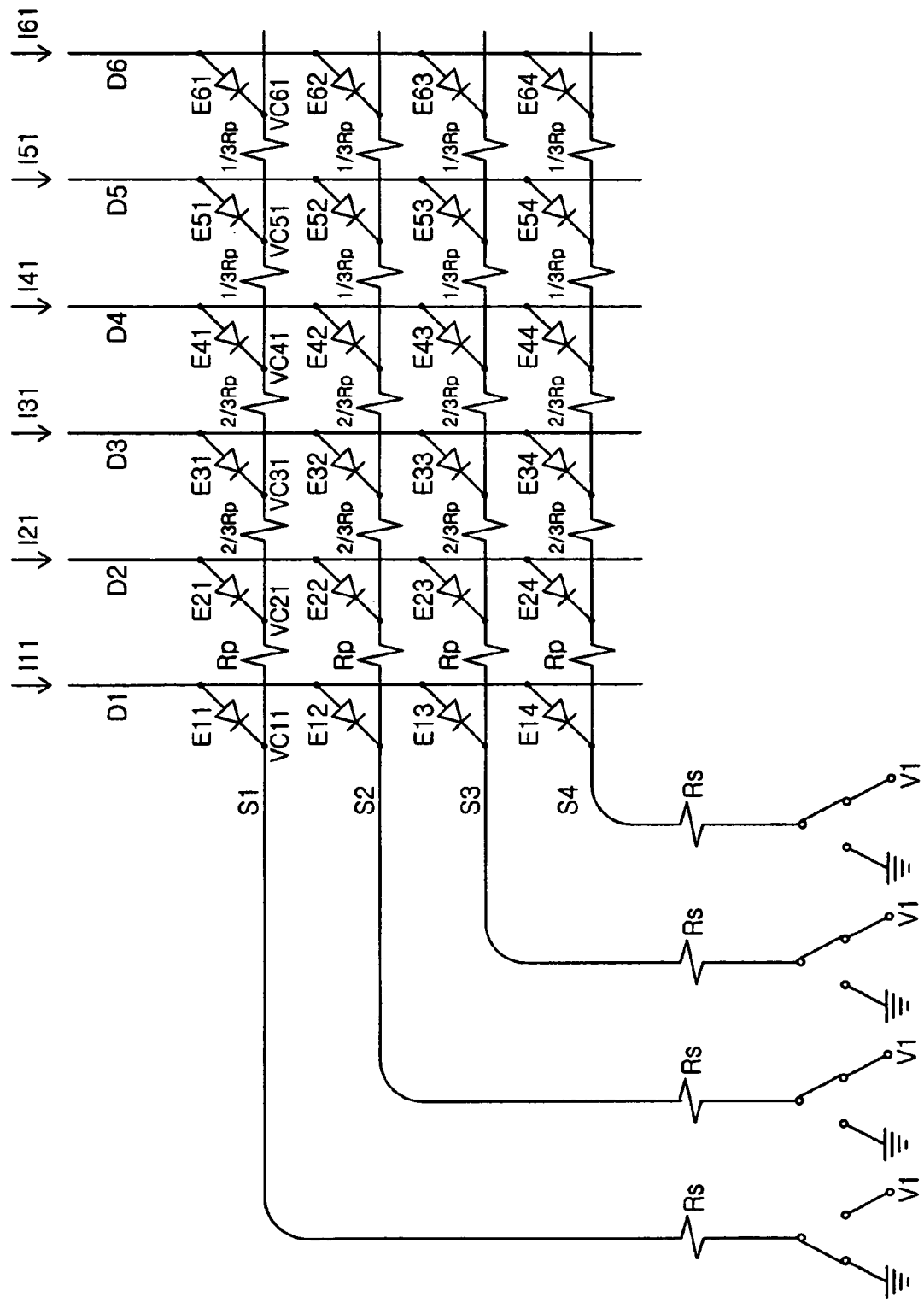
FIG. 10B is a view illustrating a circuitry of the light emitting device in FIG. 10A.

FIG. 10A is a plan view illustrating a light emitting device according to a fifth embodiment of the present invention. FIG. 10B is a view illustrating a circuitry of the light emitting device in FIG. 10A.

In FIG. 10A, the light emitting device of the present invention includes anode electrode layers 1000, cathode electrode layers 1002, pixels 1004, walls 1006, anode lines 1008, cathode lines 1010 and a driver 1012.

Since the elements of the present embodiment except the cathode electrode layers 1002 are the same as in the fourth embodiment, any further description concerning the same elements will be omitted.

In cathode electrode layer of the present embodiment unlike the cathode electrode layers 802 in the fourth embodiment, its width is increased in units of N (integer of above 2) anode electrode layers in a direction of a second end from a first end coupled to corresponding cathode line. For example, the width of the cathode electrode layers 1002 is increased in units of two anode electrode layers as shown in 10A. As a result, the light emitting device has resistors as shown in FIG. 10B.

Figure 11A:
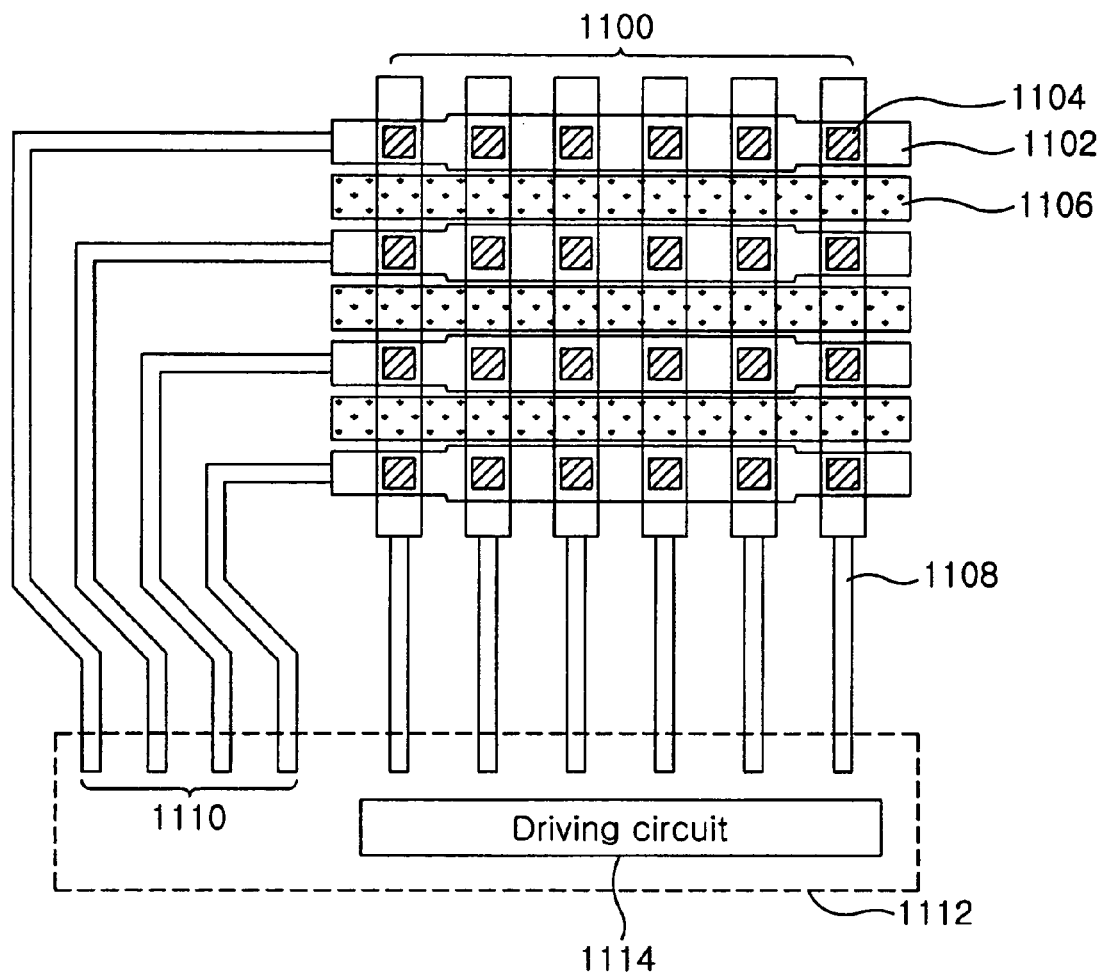
FIG. 11A is a plan view illustrating a light emitting device according to a sixth embodiment of the present invention.
Figure 11B:
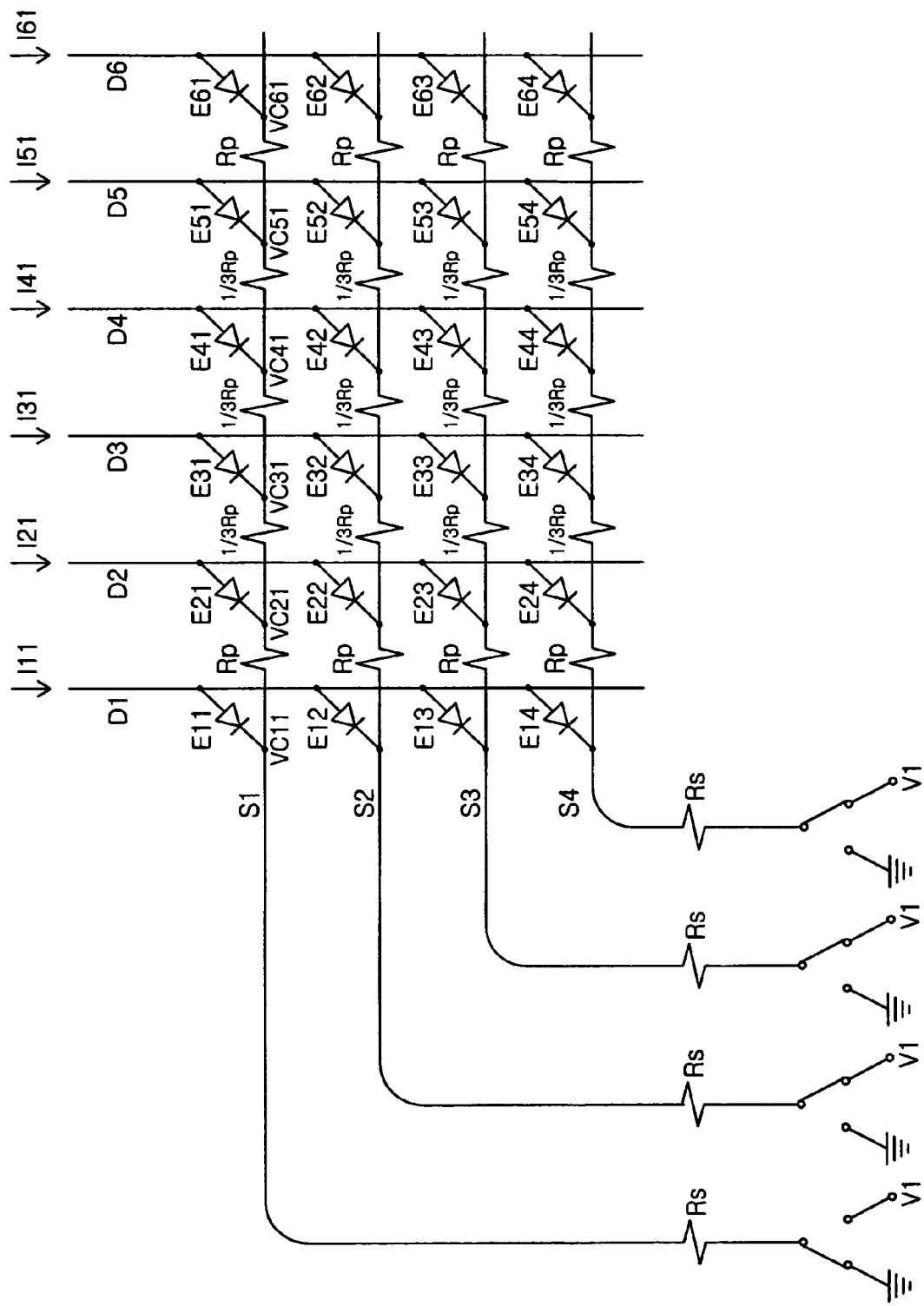
FIG. 11B is a view illustrating a circuitry of the light emitting device in FIG. 11A.

FIG. 11A is a plan view illustrating a light emitting device according to a sixth embodiment of the present invention. FIG. 11B is a view illustrating a circuitry of the light emitting device in FIG. 11A.

In FIG. 11A, the light emitting device of the present invention includes anode electrode layers 1100, cathode electrode layers 1102, pixels 1104, walls 1106, anode lines 1108, cathode lines 1110 and a driver 1112.

Since the elements of the present embodiment except the cathode electrode layers 1102 are the same as in the fourth embodiment, any further description concerning the same elements will be omitted.

In each of the cathode electrode layers 1102, width of its ends is small, but width of other parts except the ends is higher than that of the ends. As a result, the light emitting device has resistors as shown in FIG. 11B.

From the preferred embodiments for the present invention, it is noted that modifications and variations can be made by a person skilled in the art in light of the above teachings. Therefore, it should be understood that changes may be made for a particular embodiment of the present invention within the scope and the spirit of the present invention outlined by the appended claims.

What is claimed is:

1. A light emitting device, comprising:
anode electrode layers disposed in a first direction;
cathode electrode layers disposed in a second direction different from the first direction, wherein each of the cathode electrode layers consists of both ends and a connection portion directly connected to the both ends and widths of the both ends are smaller than that of the connection portion, and wherein the connection portion has a constant width;
a plurality of pixels formed in cross areas of the anode electrode layers and the cathode electrode layers; and
cathode lines coupled to the cathode electrode layers,
wherein in one cathode electrode layer, at least one of resistors between parts corresponding to pixels except a first pixel nest next to a cathode line corresponding to the cathode electrode layer has resistance smaller than resistor between a part corresponding to the first pixel and a part corresponding to a pixel next to the first pixel.

2. The light emitting device of claim 1, further comprising:
walls disposed between the cathode electrode layers to separate electrically the cathode electrode layers.

3. The light emitting device of claim 2, wherein width of at least one of the walls is changed.

4. The light emitting device of claim 2, wherein width of each of the walls is constant through its whole area.

5. The light emitting device of claim 1, wherein the cathode lines includes:
first cathode lines coupled to some of the cathode electrode layers; and
second cathode lines coupled to the other cathode electrode layers.

6. The light emitting device of claim 1, further comprising:
anode lines coupled to the anode electrode layers;
a scan driving circuit configured to transmit scan signals to the cathode electrode layers through the cathode lines; and
a data driving circuit configured to provide data currents to the pixels through the anode lines and the anode electrode layers.

7. The light emitting device of claim 1, further comprising:
anode lines coupled to the anode electrode layers;

a first scan driving circuit configured to transmit first scan signals to some of the cathode electrode layers through the cathode lines corresponding to the some;

a second scan driving circuit configured to transmit second scan signals to the other cathode electrode layers through the other cathode lines; and a data driving circuit configured to provide data currents to the pixels through the anode lines and the anode electrode layers.

8. The light emitting device of claim 1, wherein the light emitting device is organic electroluminescent device.

9. A light emitting device, comprising:

anode electrode layers disposed in a first direction;

cathode electrode layers disposed in a second direction different from the first direction, wherein each of the cathode electrode layers consists of both ends and a connection portion directly connected to the both ends and widths of the both ends are smaller than that of the connection portion, and wherein the connection portion has a constant width;

a plurality of pixels formed in first cross area of one anode electrode layer of the anode electrode layers and one cathode electrode layer and second cross areas of the other anode electrode layers and the cathode electrode layer, wherein at least one of the second cross areas is wider than the first cross area.

10. The light emitting device of claim 7, further comprising:

cathode lines coupled to the cathode electrode layers, wherein the first cross area is located next to cathode line coupled to the cathode electrode layer.

11. The light emitting device of claim 9, wherein one or more of the pixels includes an emitting layer which is made of organic material.

12. The light emitting device of claim 9, further comprising:

walls disposed between the cathode electrode layers to separate electrically the cathode electrode layers.

13. The light emitting device of claim 12, wherein width of at least one of the walls is changed.

14. The light emitting device of claim 12, wherein each of the walls has a constant width.

15. The light emitting device of claim 9, further comprising:

anode lines coupled to the anode electrode layers;

a scan driving circuit configured to transmit first scan signals to the cathode electrode layers through the cathode lines; and a data driving circuit configured to provide data currents to the pixels through the anode lines and the anode electrode layers.

16. The light emitting device of claim 9, further comprising:

anode lines coupled to the anode electrode layers;

a first scan driving circuit configured to transmit first scan signals to some of the cathode electrode layers through the cathode lines corresponding to the some;

a second scan driving circuit configured to transmit second scan signals to the other cathode electrode layers through the cathode lines corresponding to the other cathode electrode layers; and a data driving circuit configured to provide data currents to the pixels through the anode lines and the anode electrode layers.

* * * * *